US005511994A

United States Patent [19]

Minich

[11] Patent Number: 5,511,994

[45] Date of Patent: Apr. 30, 1996

[54] ELECTRICAL CONNECTOR HAVING A DEVICE RETAINING MEANS AND A METHOD OF ASSEMBLY THEREOF

[75] Inventor: Steven E. Minich, Carlisle, Pa.

[73] Assignee: The Whitaker Corporation, Wilmington, Del.

[21] Appl. No.: 278,489

[22] Filed: Jul. 21, 1994

[51] Int. Cl.[6] .............. H01R 9/09; H05K 1/00

[52] U.S. Cl. .............. 439/620; 29/881

[58] Field of Search .............. 439/620, 79; 29/876, 29/881

[56] References Cited

U.S. PATENT DOCUMENTS

| | | | |
|---|---|---|---|
| 4,148,543 | 4/1979 | Shores | 339/143 R |
| 4,772,224 | 9/1988 | Talend | 439/607 |
| 4,995,834 | 2/1991 | Hasegawa | 439/620 |
| 5,022,870 | 6/1991 | Sakamoto et al. | 439/608 |
| 5,026,293 | 6/1991 | Wilson | 439/76 |
| 5,133,679 | 7/1992 | Fusselman et al. | 439/608 |
| 5,135,405 | 8/1992 | Fusselman et al. | 439/108 |
| 5,141,454 | 8/1992 | Garrett et al. | 439/620 |
| 5,150,086 | 9/1992 | Ito | 333/182 |
| 5,224,878 | 7/1993 | Lurie et al. | 439/620 |
| 5,238,414 | 8/1993 | Yaegashi et al. | 439/608 |
| 5,257,950 | 11/1993 | Lenker et al. | 439/620 |
| 5,286,221 | 2/1994 | Fencl et al. | 439/620 |
| 5,415,569 | 5/1995 | Colleran et al. | 439/620 |

*Primary Examiner*—Neil Abrams
*Assistant Examiner*—Barry Matthew L. Standig

[57] ABSTRACT

An electrical connector 1 having a mating section 12 and a mounting surface 14. The mounting surface 14 having a device receiving recess 19 therealong with a retaining lip 24. Contacts 40 having contact terminating sections 44 extending through the recess 19 and beyond the mounting surface 14. A device 50 is secured in the recess 19 by a combination of spring forces of the contacts 40 and the retaining lip 24.

A method of assembling an electrical connector 1 having a device 50 secured in a device receiving recess 19 along a mounting surface 14. The method involves first placing the device 50 onto the contact terminating sections 44, moving the device 50 above and then behind the retaining lip 24 by pushing against spring forces of the contacts 40, and then lowering the device 50 behind the retaining 24 lip and releasing the spring forces.

12 Claims, 4 Drawing Sheets

ELECTRICAL CONNECTOR HAVING A DEVICE RETAINING MEANS AND A METHOD OF ASSEMBLY THEREOF

FIELD OF THE INVENTION

The invention relates to an electrical connector having a device retained in the mounting surface of the connector by mechanical means and a method of assembling the connector.

BACKGROUND OF THE INVENTION

Often, a device is installed between a mounting surface of an electrical connector and a circuit board. This method of installation requires some means of securing the device to the circuit board and the connector. Some methods of securing the device have included interference fit between holes in the device and the electrical contacts, soldering of the contacts to the connector, the device and the circuit board, and using adhesives to bond the filter to the connector.

These methods all require additional steps beyond inserting the contacts through the device and into the circuit board. There are times when it would be advantageous to install the device without having to use solder, adhesive or interference fit. Furthermore, it would be advantageous to have the device installed as part of the connector.

Electrical circuitry often must be protected from disruptions caused by electromagnetic interference (EMI) and radio frequency interference (RFI) entering the system.

Frequently, today's electronic circuitry requires the use of high density, multiple contact electrical connectors. There are many applications in which it is desirable to provide a connector with a filtering capability.

One method of providing a filter in an electrical connector is to mount the filter between a circuit board and the electrical connector. An example of the type of connector is shown in U.S. Pat. No. 5,257,950. The filter 100, as seen in FIG. 7 herein, is secured between a circuit board and the connector 104 and requires soldering of the filter 100 to the contacts 106 and the ground wall 108. Other filters are secured to the contacts between the connector and the board by an adhesive or by an interference fit between the contacts and the filter.

The purpose of this invention is to provide a connector with a device, such as a filter, that is retained in the housing along the mounting surface of the connector without the need for the use of soldering, adhesives, or interference fit. A further purpose of this invention is to provide a method of installing the device along the mounting surface.

SUMMARY OF THE INVENTION

Accordingly, the present invention is directed to an electrical connector that overcomes the problems described above. The connector includes a housing having a mounting surface, a plurality of contacts, and a device disposed along the mounting surface. The mounting surface has a forwardly disposed retaining lip. The device is retained along the mounting surface by a combination of the spring forces of the contacts and the retaining lip.

The present invention is further directed to a method of assembling a connector with a device secured along the mounting surface of the connector. The method involves first placing the device over the contact terminating sections of the electrical contacts, and is then moved into position behind the retaining lip by pushing the device up, against the spring forces of the contacts until the device is above the retaining lip. The device is then moved further onto the contacts until it is past the retaining lip. Finally, the device is moved behind the retaining lip by releasing the spring forces on the contacts and lowering the device. The device is then held in place by the retaining lip and the cumulative spring forces of the contacts.

The invention is further directed to a connector having a filter along a mounting surface of the connector. The filter is secured along the mounting surface by the spring forces of the contacts and the retaining lip.

The invention is still further directed to a method of assembling the connector with a filter in the mounting surface.

BRIEF DESCRIPTION OF THE DRAWINGS

Embodiments of the present invention will now be described by way of example with reference to the accompanying drawings, in which.

DETAILED DESCRIPTION OF THE INVENTION

Figure 1:
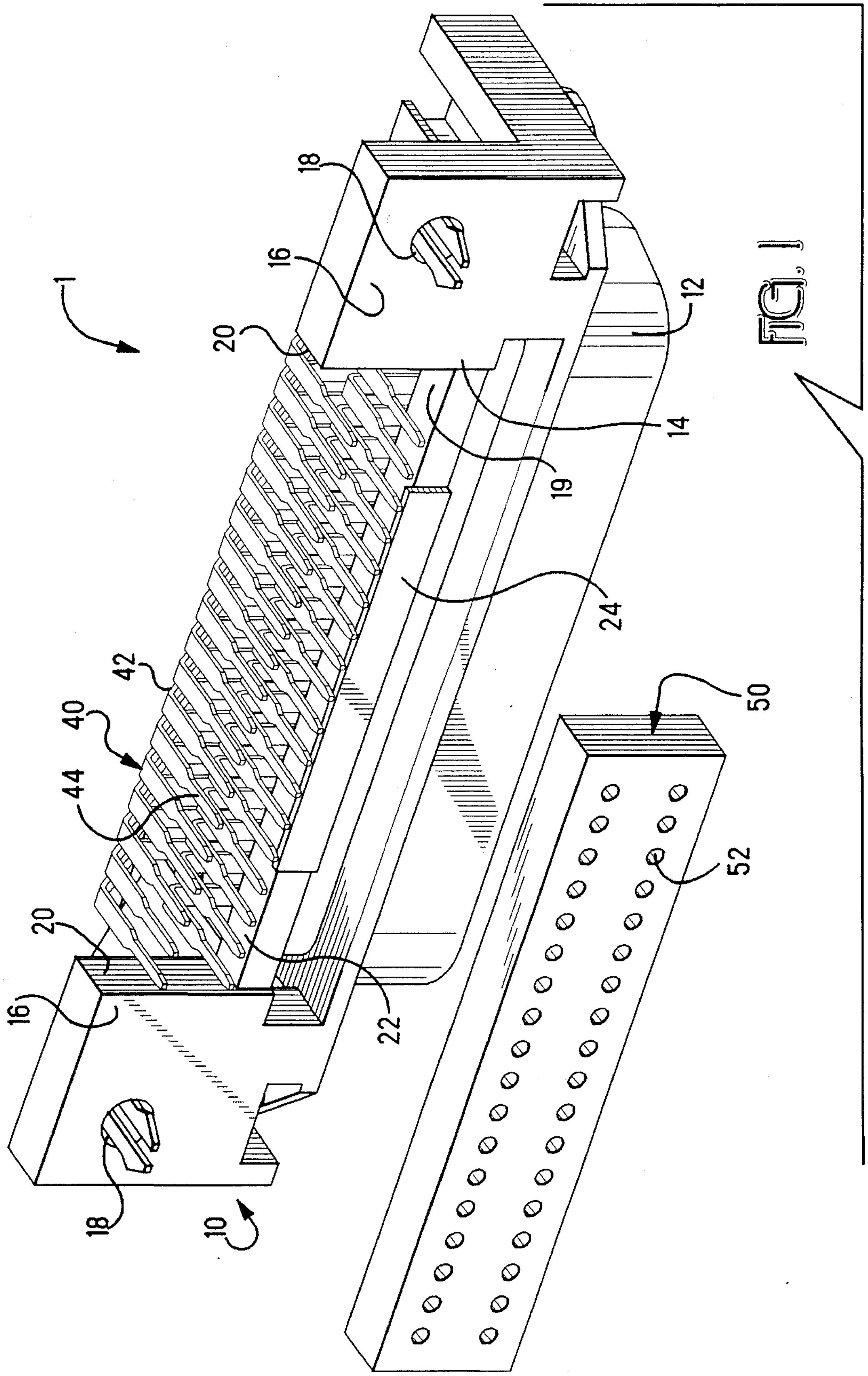
FIG. 1 is an exploded perspective view of the connector of the present invention.

In FIG. 1, the connector 1 includes a housing 10 having a mating section 12 which is adapted to be mated to a complementary connector (not shown) and a mounting surface 14 for mounting to a circuit board (not shown). The mounting surface 14 has mounting flanges 16 on either side, having mounting holes 18 for securing the connector 1 to the circuit board. The mounting surface 14 has a device receiving recess 19 defined by side walls 20 along the sides of the mounting flanges and a bottom wall 22. The bottom wall 22 has a retaining lip 24.

Figure 6:
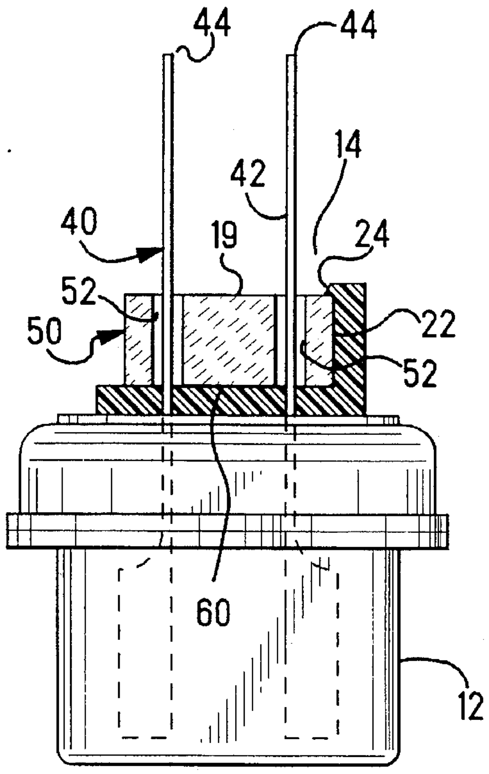
FIG. 6 is a partial cross sectional view of an alternative embodiment of a fully assembled connector.
Figure 7:
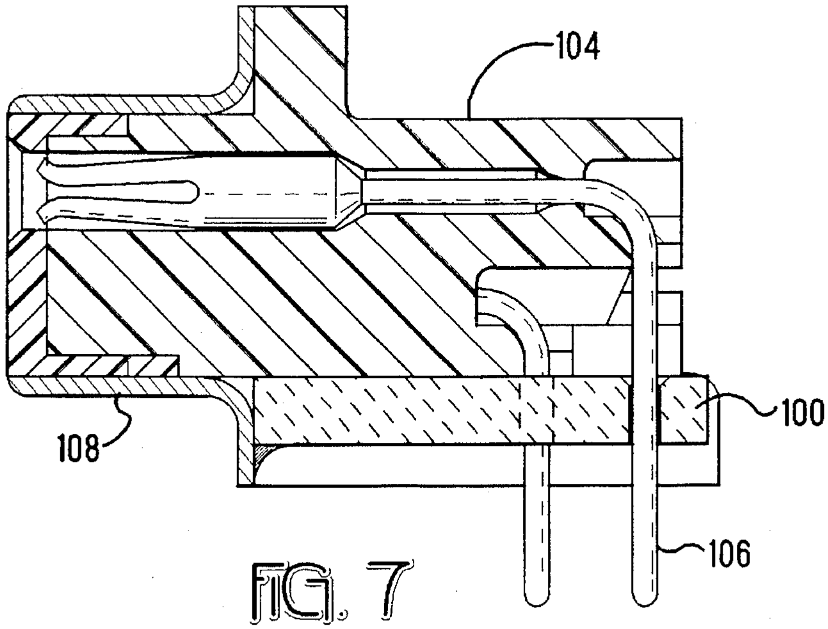
FIG. 7 Prior Art
FIG. 7 a cross sectional view of a prior art connector.

The connector 1 has electrical contacts 40 secured within the housing 10. The contacts 40 have a middle section 42 which is a resilient spring section. The contacts 40 also have terminating sections 44 which extend from the middle section 42 through the device receiving recess 19 and beyond the housing 10, see FIG. 2. The contacts 40 also have contact sections (not shown) which are disposed within the mating section 12 for electrically connecting to the matable connector. The contacts 40 are secured in the housing 10 between the mating section 12 and the mounting surface 14 in contact receiving holes. In the illustrated embodiment, the contacts are shown arranged in two rows and in a right-angled connector configuration. The contacts may also be arranged in other arrangements or configurations such as a straight through connector as is shown in FIG. 6.

The connector 1 further has a device 50 disposed in the recess 19. The device may be a ferrite inductor filter, but may also be a capacitor filter as disclosed in U.S. Pat. No.

5,257,950, or a contact aligning or positioning device as known in the art. The device 50 has contact receiving apertures 52. The apertures 52 are arranged in the device 50 so as to be aligned with the contact terminating sections 44. The apertures 52 are dimensioned such that the terminating sections 44 are easily received in the apertures 52.

Figure 2:
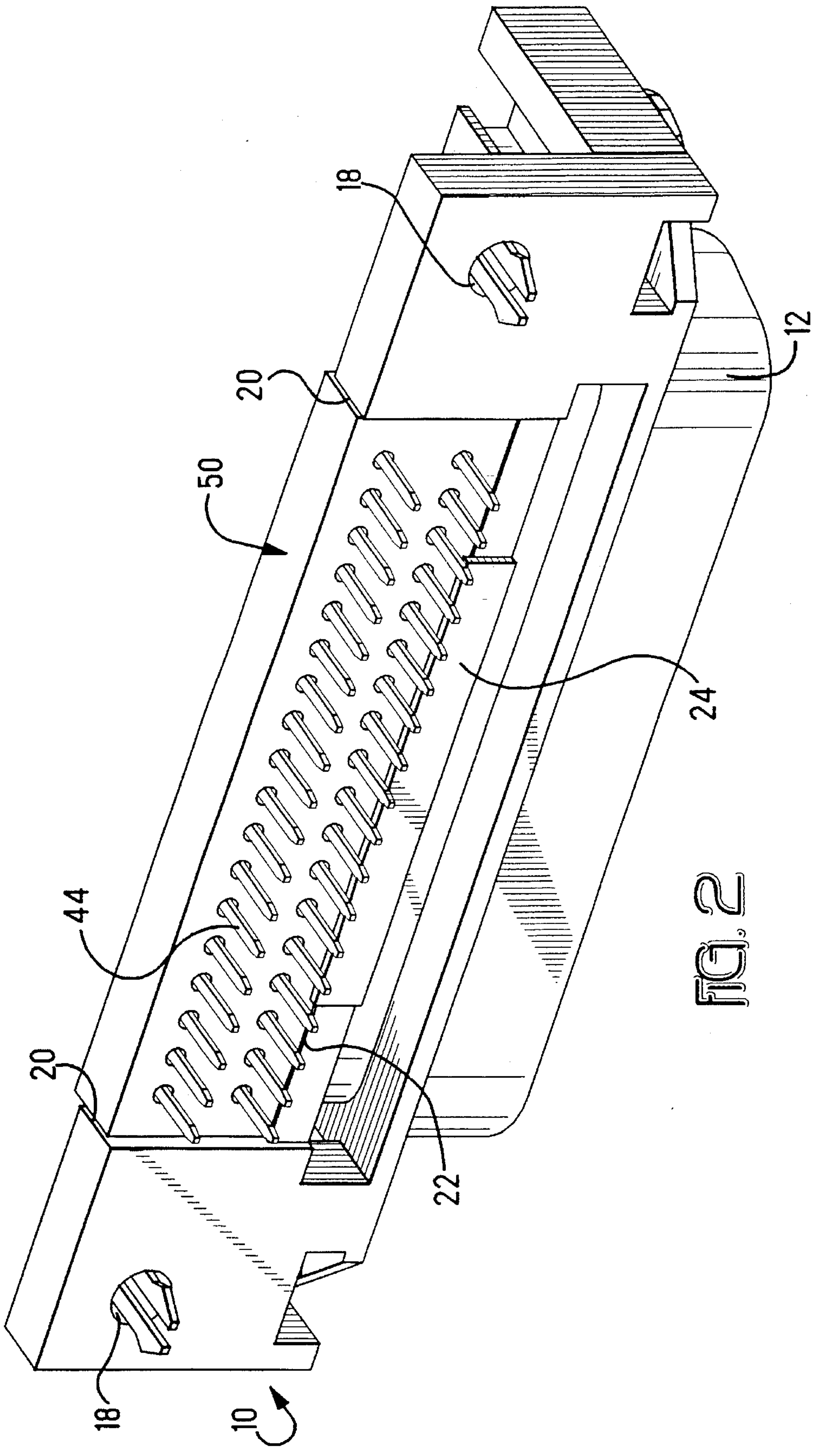
FIG. 2 is a perspective view of the connector and the device fully assembled.
Figure 3:
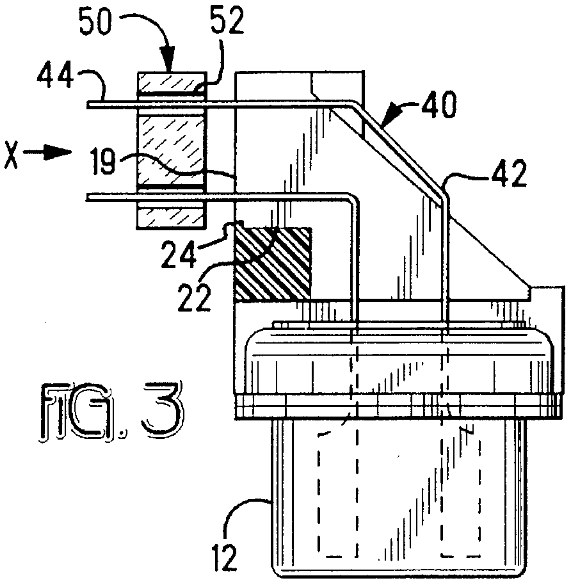
FIG. 3 is a partial cross sectional view of the connector with device in a first position on the contacts.
Figure 4:
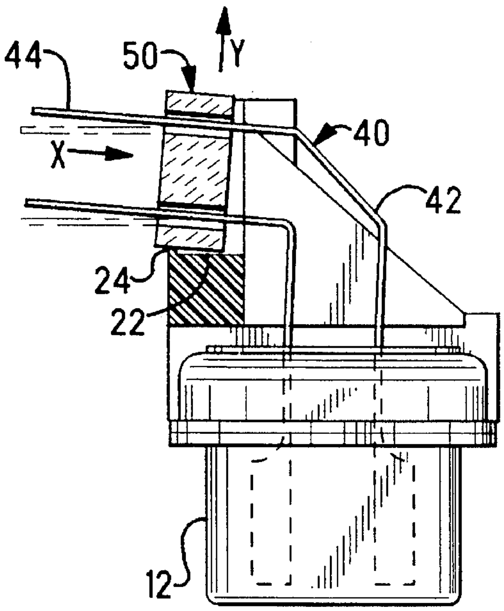
FIG. 4 is a similar view to FIG. 3 showing the device and the connector partially assembled.
Figure 5:
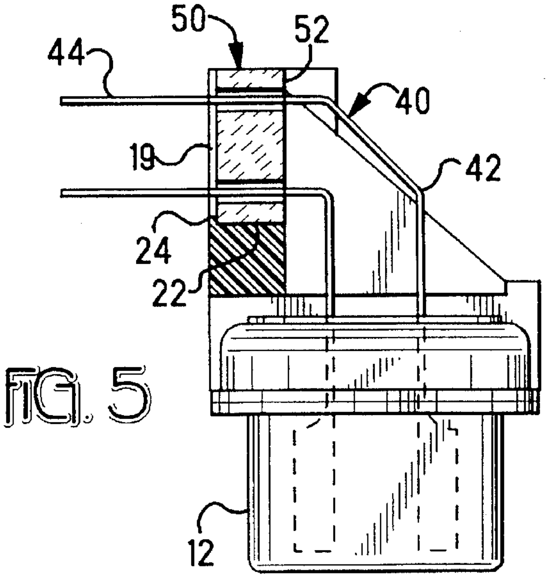
FIG. 5 is a similar view to FIGS. 3 and 4 showing the connector with the device in the fully assembled position.

The device 50 is installed in the recess 19 by first sliding the device 50 onto the contact terminating sections 44, in the direction X, so that the terminating sections 44 extend into the apertures 52, see FIG. 2. The device 50 is then pushed up in the direction Y, see FIG. 3, against the spring forces of the resilient middle sections 42 of the contacts 40, until the device 50 is above the top wall of the retaining lip 24. The device 50 is then pushed further onto the contact terminating sections 44 in the direction X until the device 50 is past the retaining lip 24. The device 50 is then lowered to the bottom wall 22 behind the back side of the retaining lip 24.

The device 50 is then held in place within the recess 19 by the combination of the cumulative spring forces of the contacts 40 and the retaining lip 24. The device 50 is further held in place by the walls of the recess 19. The device is prevented from moving backwards by the first row of contacts 40.

An alternative embodiment of the invention is shown in FIG. 6. The connector of this embodiment has straight through contacts 40 having terminating sections 44 and resilient middle sections 42. The terminating sections 44 extend through a device receiving recess 19 which has a retaining lip 24 and a bottom wall 22. The recess 19 further has a back wall 60.

The connector in FIG. 6 is assembled by sliding the device 50 onto the contact terminating sections 44 so that the terminating sections 44 extend into the apertures 52. The device 50 is then pushed against the spring forces of the resilient middle sections 42 so that the device can be moved past the retaining lip 24. Finally, the device 50 is released against the bottom wall 22 and held in place in the recess 19 by cumulative spring forces and the retaining lip 24. The device is further held in place by the back wall 60.

The device 50 is thereby secured along the mounting surface 14 of the connector without the use of soldering, adhesives, or an interference fit around the contacts 40. The contact terminating sections 44 are held in alignment in the device for subsequent attachment with the contacts on the circuit board. Moreover, the bottom surface of the device does not engage the circuit board, the device is held above the circuit board by the retaining lip 24. The connection to the circuit board is illustrated as involving through post connectors, but the connection could also involve surface mount connection. The connector 1 can now, as a one piece unit, be mounted to the circuit board.

Another advantage of the invention is that the apertures 52 have a diameter such that the terminating sections 44 extend easily through the apertures 52. Thus the close tolerance ranges during manufacture are not needed as would be required for interference fit.

It is thought that the electrical connector of the present invention and many of its attendant advantages will be understood from the foregoing description. It is apparent that various changes may be made in the form, construction, and arrangement of parts thereof without departing from the spirit or scope of the invention, or sacrificing all of its material advantages.

I claim:

1. An electrical connector comprising:

a housing having a mating section for connecting to matable connector, and having a mounting surface for mounting to a circuit board, the mounting surface having a device receiving recess with a retaining lip;

contacts formed of resilient material and being disposed in the housing having contact terminating sections disposed in the device receiving recess; and a device disposed within the device receiving recess, the device having apertures therethrough, the contact terminating sections extending through the apertures, the device being assembled to the housing by movement along the contact terminating sections until the device snaps behind the retaining lip, and the device being secured in the device receiving recess by a combination of cumulative spring forces of the contacts and the retaining lip, the cumulative spring forces being perpendicular to the contact termination sections.

2. The connector of claim 1, wherein the device is a ferrite inductor filter.

3. The connector of claim 1, wherein said mounting surface has mounting flanges.

4. The connector of claim 3, wherein said recess is defined by side walls along the mounting flanges and a bottom wall on which the retaining lip is disposed.

5. The connector of claim 1, wherein the contacts have resilient middle sections and contact sections disposed in the mating section.

6. The connector of claim 5, wherein the resilient middle section has the spring forces.

7. The connector of claim 1, wherein the connector is a right-angled connector.

8. The connector of claim 7, wherein the contacts are aligned in two rows.

9. The connector of claim 8, wherein one row of contacts prevents the device from moving backwards in the device receiving recess.

10. The connector of claim 1, wherein the connector is a straight through connector having straight contacts.

11. The connector of claim 10, wherein the recess has a back wall and the device is prevented from moving backwards by the back wall.

12. A method of assembling an electrical connector and a device, the connector having a mating section and a mounting surface and contacts formed of resilient material and being secured in the connector, the contacts having contact terminating sections with spring forces perpendicular to the contact terminating sections, the mounting surface having a retaining lip therealong; comprising the steps of:

placing the device onto the contacts by sliding the terminating sections into apertures in the device;

moving the device above the retaining lip in the mounting surface by pushing the device against he spring forces of the contacts; and sliding the device further onto the contacts until the device is behind the retaining lip;

whereby the device is then held in place by a combination of the retaining lip and the cumulative spring forces of the contacts.

* * * * *